US006995619B2

(12) United States Patent
Cho

(10) Patent No.: US 6,995,619 B2
(45) Date of Patent: Feb. 7, 2006

(54) QUADRATURE VOLTAGE CONTROLLED OSCILLATOR CAPABLE OF VARYING A PHASE DIFFERENCE BETWEEN AN IN-PHASE OUTPUT SIGNAL AND A QUADRATURE OUTPUT SIGNAL

(75) Inventor: Je-kwang Cho, Seongnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 10/756,676

(22) Filed: Jan. 13, 2004

(65) Prior Publication Data

US 2004/0169561 A1    Sep. 2, 2004

(30) Foreign Application Priority Data

Feb. 28, 2003  (KR)  ....................... 10-2003-0012814

(51) Int. Cl.
    *H03B 27/00*  (2006.01)
(52) U.S. Cl. ............................. 331/45; 331/46; 331/2; 331/117 FE; 331/185; 331/175
(58) Field of Classification Search ................. 331/46, 331/135, 2, 108 B, 45, 117 FE, 185, 175
    See application file for complete search history.

(56) References Cited

U.S. PATENT DOCUMENTS 6,462,626 B1 * 10/2002 Gharpurey .............. 331/108 B

FOREIGN PATENT DOCUMENTS

JP    2002-319823    10/2002
KR    P2002-0089226  11/2002

* cited by examiner

Primary Examiner—Arnold Kinkead
(74) Attorney, Agent, or Firm—F.Chau & Associates, LLC

(57) ABSTRACT

Provided is a quadrature voltage controlled oscillator capable of varying a phase difference between an in-phase output signal and a quadrature output signal. The quadrature voltage controlled oscillator comprises a first voltage controlled oscillator, a second voltage controlled oscillator, a first amplifier, a second amplifier, a third amplifier, and a fourth amplifier. The first voltage controlled oscillator generates a first output and a second output. The second voltage controlled oscillator generates a third output and a fourth output. The first output is a positive in-phase signal, and the second output is a negative in-phase signal. The third output is a positive quadrature signal, and the fourth output is a negative quadrature signal. The first amplifier is controlled by a first current and drives the first output and the second output in response to the third output and the fourth output. The second amplifier is controlled by a second current and drives the first output and the second output in response to the third output and the fourth output. The third amplifier is controlled by a third current and drives the third output and the forth output in response to the first output and the second output. The fourth amplifier is controlled by a fourth current and drives the third output and the forth output in response to the first output and the second output.

18 Claims, 5 Drawing Sheets

QUADRATURE VOLTAGE CONTROLLED OSCILLATOR CAPABLE OF VARYING A PHASE DIFFERENCE BETWEEN AN IN-PHASE OUTPUT SIGNAL AND A QUADRATURE OUTPUT SIGNAL

BACKGROUND OF THE INVENTION

1. Technical Field

The present invention relates to a quadrature voltage controlled oscillator (VCO), and more particularly, to a quadrature VCO capable of varying a phase difference between an in-phase output signal and a quadrature output signal.

2. Discussion of the Related Art

Current mobile communication systems use low-intermediate frequency (Low-IF) way or direct-conversion way rather than heterodyne way to convert a radio frequency (RF) signal to a baseband signal. Thus, a VCO used in such mobile communication systems should generate both an in-phase output signal (I output signal) and a quadrature output signal (Q output signal).

The I and Q output signals may be generated using a poly-phase-filter shown in FIG. 1, a divider shown in FIG. 2, or two VCOs shown in FIG. 3.

When the I and Q output signals are generated using the poly-phase-filter as shown in FIG. 1, the poly-phase-filter is located in a path through which signals pass. Thus, signal loss occurs, making it difficult to generate I and Q output signals. In addition, the I and Q output signals are affected by the operation frequency and layout of the poly-phase-filter. When the I and Q output signals are generated using the divider as shown in FIG. 2, precise I and Q output signals can be obtained. However, a VCO, which oscillates at a frequency double a desired frequency, is required. When the I and Q output signals are generated using two VCOs as shown in FIG. 3, the two VCOs have the same structure and form a feedback loop therebetween. As a result, the I and Q output signals are spontaneously generated. This is disclosed in U.S. Pat. No. 6,462,626, issued on Oct. 8, 2002, entitled "Quadrature Output Oscillator Device."

The above-described methods have a common problem in that a phase difference between the I and Q output signals is ideally fixed at 90° or substantially fixed at 90°±offset. In other words, when the I and Q output signals are applied from a VCO to a down-mixer in the direct-conversion method, the down-converted signals should be ideally 90° out of phase, but substantially not. This results in deterioration of a bit error rate of a transceiver.

In addition, in the Low-IF method, the image-rejection characteristics of an RF signal should be good. However, it is difficult to expect good image-rejection characteristics from the above-described methods.

SUMMARY OF THE INVENTION

According to an aspect of the present invention, a quadrature voltage controlled oscillator comprises a first voltage controlled oscillator, a second voltage controlled oscillator, a first amplifier, a second amplifier, a third amplifier, a fourth amplifier, a control signal generating circuit, a first current controlling circuit, and a second current controlling circuit. The first voltage controlled oscillator generates a first output and a second output. The second voltage controlled oscillator generates a third output and a fourth output. The first output is a positive in-phase signal, and the second output is a negative in-phase signal. The third output is a positive quadrature signal, and the fourth output is a negative quadrature signal.

The first amplifier is controlled by a first current and drives the first voltage controlled oscillator in response to the second voltage controlled oscillator. The second amplifier is controlled by a second current and drives the first voltage controlled oscillator in response to the second voltage controlled oscillator.

The third amplifier is controlled by a third current and drives the second voltage controlled oscillator in response to the first voltage controlled oscillator. The fourth amplifier is controlled by a fourth current and drives the second voltage controlled oscillator in response to the first voltage controlled oscillator.

The second current is a value obtained from subtraction of the first current from a reference current, and the fourth current is a value obtained from subtraction of the third current from a reference current.

The control signal generating circuit enables a first control signal when an input voltage is greater than a reference voltage, and enables a second control signal when the input voltage is less than the reference voltage. The first current controlling circuit varies the first current and the second current depending on a voltage difference between the input voltage and the reference voltage when the first control signal is enabled. The second current controlling circuit varies the third current and the fourth current depending on the voltage difference between input voltage and the reference voltage when the second control signal is enabled.

Accordingly, the first through fourth currents vary depending on a level of the input voltage so as to vary phase differences between the positive and negative in-phase output signals and the positive and negative quadrature output signals.

BRIEF DESCRIPTION OF THE DRAWINGS

The above features of the present invention will become more apparent by describing in detail exemplary embodiments thereof with reference to the attached drawings, in which.

DETAILED DESCRIPTION OF EXEMPLARY EMBODIMENTS

Figure 1:
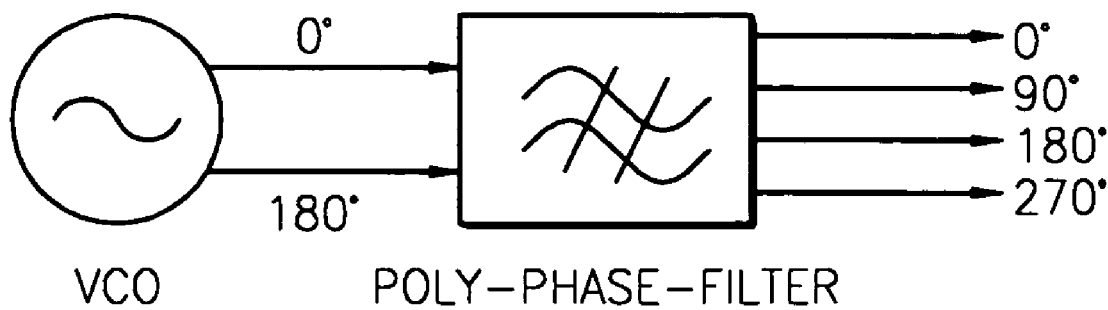
FIG. 1 illustrates a method of generating I and Q output signals using a poly-phase-filter.
Figure 2:
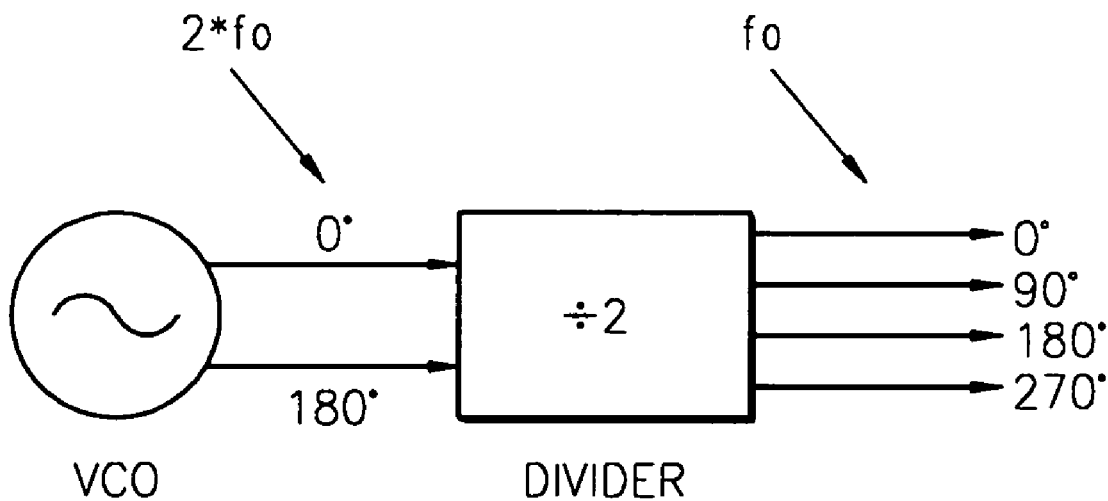
FIG. 2 illustrates a method of generating I and Q output signals using a divider.
Figure 3:
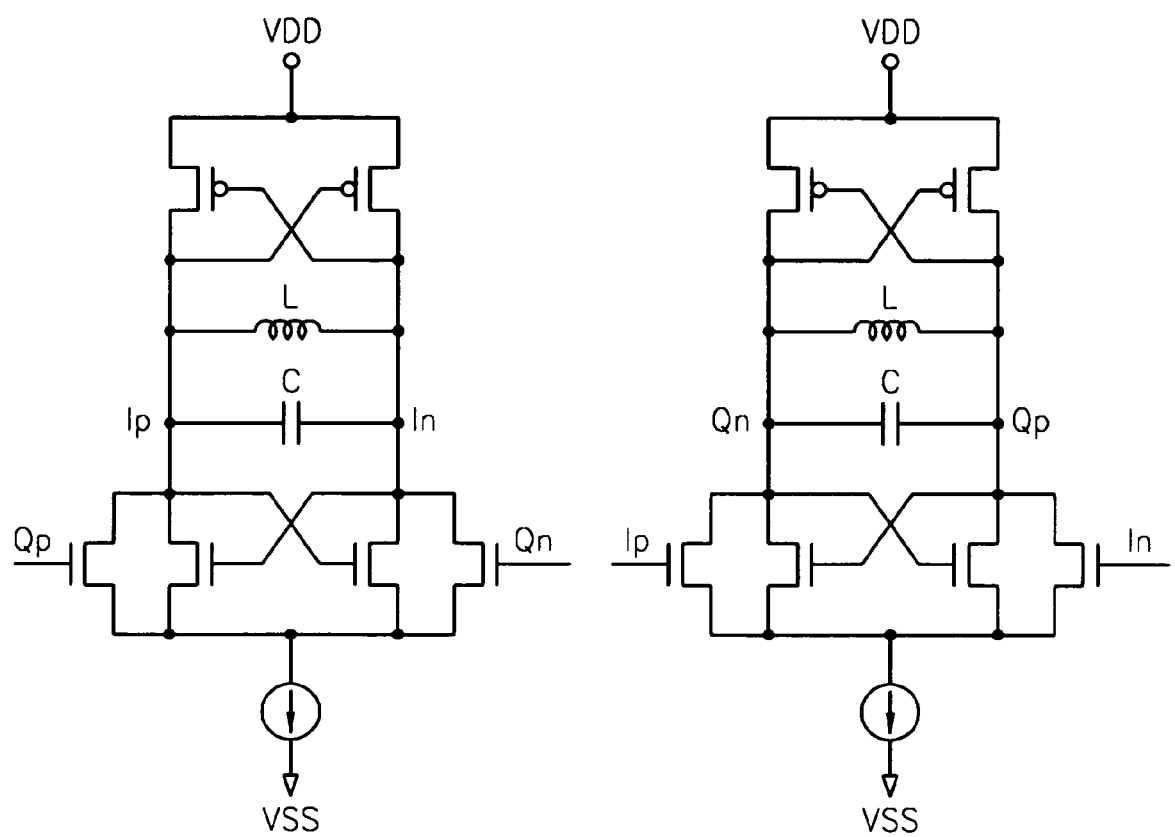
FIG. 3 illustrates a method of generating I and Q output signals using two VCOs.
Figure 4:
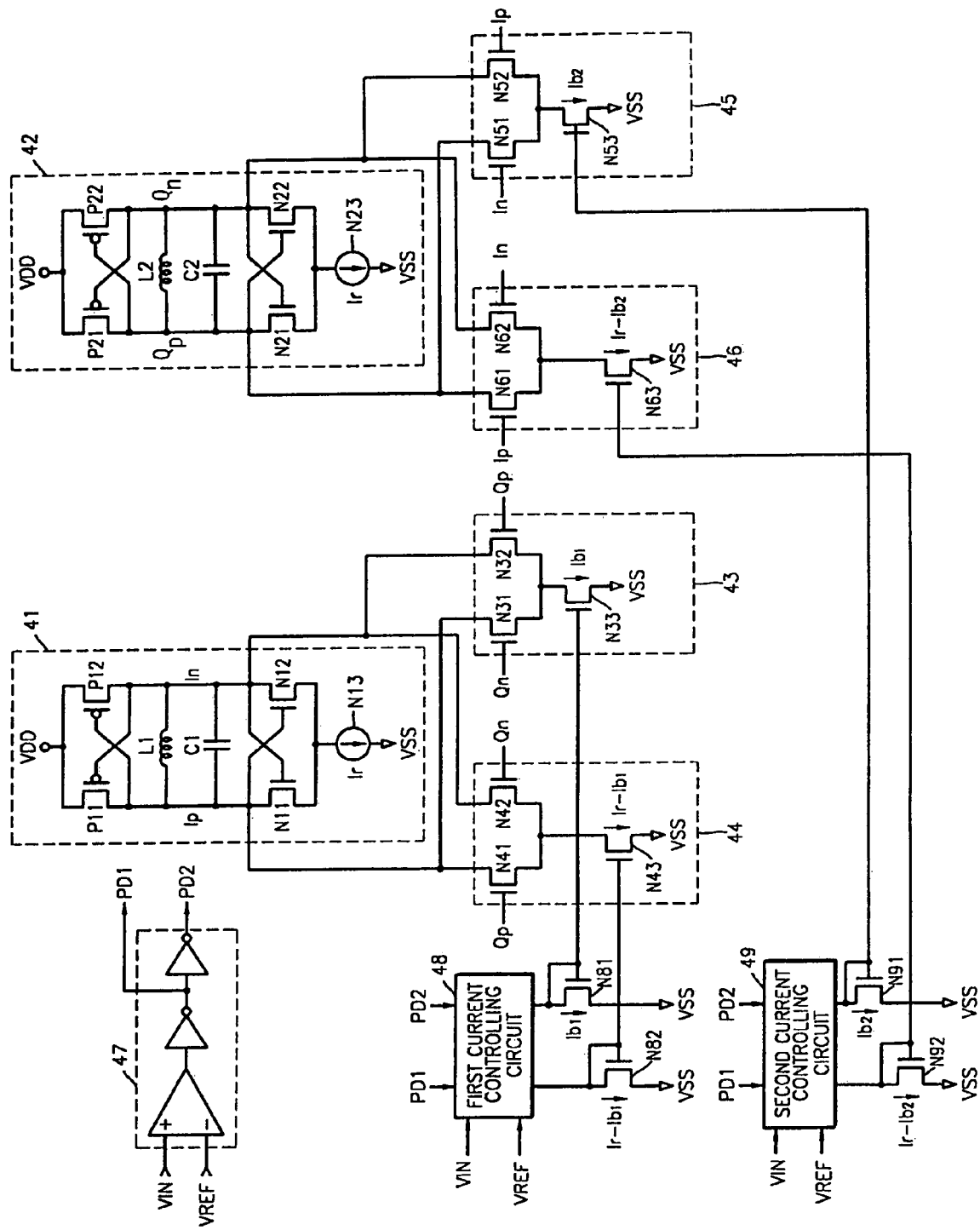
FIG. 4 shows a quadrature VCO according to an exemplary embodiment of the present invention.

FIG. 4 shows a quadrature VCO according to an embodiment of the present invention. Referring to FIG. 4, the quadrature VCO includes a first VCO 41, a second VCO 42, a first amplifier 43, a second amplifier 44, a third amplifier 45, a fourth amplifier 46, a control signal generating circuit 47, a first current controlling circuit 48, and a second current controlling circuit 49.

The first VCO 41 generates a first output Ip and a second output In, and the second VCO 42 generates a third output Qp and a fourth output Qn. The first output Ip is a positive in-phase signal, and the second output In is a negative in-phase signal. The third output Qp is a positive quadrature signal, and the fourth output Qn is a negative quadrature signal.

The first and second VCOs 41 and 42 are general VCOs and have similar structure. The first VCO 41 includes PMOS transistors P11 and P12, an inductor L1, a capacitor C1, NMOS transistors N11 and N12, and a current source N13. The second VCO 42 includes PMOS transistors P21 and P22, an inductor L2, a capacitor C2, NMOS transistors N21 and N22, and a current source N23.

The first amplifier 43 is controlled by a first current Ib1 and drives the first output Ip and the second output In of the first VCO 41 in response to the third output Qp and the fourth output Qn of the second VCO 42. The second amplifier 44 is controlled by a second current Ir-Ib1 and drives the first output Ip and the second output In of the first VCO 41 in response to the third output Qp and the fourth output Qn of the second VCO 42.

The third amplifier 45 is controlled by a third current Ib2 and drives the third output Qp and the fourth output Qn of the second VCO 42 in response to the first output Ip and the second output In of the first VCO 41. The fourth amplifier 46 is controlled by a fourth current Ir-Ib2 and drives the third output Qp and the fourth output Qn of the second VCO 42 in response to the first output Ip and the second output In of the first VCO 41.

The second current Ir-Ib1 is a value obtained from the subtraction of the first current Ib1 from a predetermined reference current Ir, and the fourth current Ir-Ib2 is a value obtained from the subtraction of the third current Ib2 from the predetermined reference current Ir.

The first amplifier 43 includes an NMOS transistor N31 having a drain to which the first output Ip is applied and a gate to which the fourth output Qn is applied, an NMOS transistor N32 having a drain to which the second output In is applied and a gate to which the third output Qp is applied, and an NMOS transistor N33 connected to a source of the NMOS transistor N31 and a source of the NMOS transistor N32 and allowing the first current Ib1 to flow in response to a gate signal.

The second amplifier 44 includes an NMOS transistor N41 having a drain to which the first output Ip is applied and a gate to which the third output Qp is applied, an NMOS transistor N42 having a drain to which the second output In is applied and a gate to which the fourth output Qn is applied, and an NMOS transistor N43 connected to a source of the NMOS transistor N41 and a source of the NMOS transistor N42 and allowing the second current Ir-Ib1 to flow in response to the gate signal.

The third amplifier 45 includes an NMOS transistor N51 having a drain to which the fourth output Qn is applied and a gate to which the second output In is applied, an NMOS transistor N52 having a drain to which the third output Qp is applied and a gate to which the first output Ip is applied, and an NMOS transistor N53 connected to a source of the NMOS transistor N51 and a source of the NMOS transistor N52 and allowing the third current Ib2 to flow in response to the gate signal.

The fourth amplifier 46 includes an NMOS transistor N61 having a drain to which the fourth output Qn is applied and a gate to which the first output Ip is applied, an NMOS transistor N62 having a drain to which the third output Qp is applied and a gate to which the second output In is applied, and an NMOS transistor N63 connected to a source of the NMOS transistor N61 and a source of the NMOS transistor N62 and allowing the fourth current Ir-Ib2 to flow in response to the gate signal.

The control signal generating circuit 47 enables a first control signal PD1 and disables a second control signal PD2 when an input voltage VIN applied from an external source is greater than a predetermined reference voltage VREF. The control signal generating circuit 47 disables the first control signal PD1 and enables the second control signal PD2 when the input voltage VIN is less than the predetermined reference voltage VREF.

When the first control signal PD1 is enabled and the second control signal PD2 is disabled, the first current controlling circuit 48 is enabled and the second current controlling circuit 49 is disabled. Thus, when the first control signal PD1 is enabled, the first current controlling circuit 48 varies the first current Ib1 and the second current Ir-Ib1 depending on a voltage difference between the input voltage VIN and the predetermined reference voltage VREF. Since the second controlling circuit 49 is disabled, the third current Ib2 becomes zero. As a result, phase differences between the in-phase signals Ip and In and the quadrature signals Qp and Qn can vary between 90° and 180°.

When the first control signal PD1 is disabled and the second control signal PD2 is enabled, the first current controlling circuit 48 is disabled and the second current controlling circuit 49 is enabled. Thus, when the second control signal PD2 is enabled, the second current controlling circuit 49 varies the third current Ib2 and the fourth current Ir-Ib2 depending on the voltage difference between the input voltage VIN and the predetermined reference voltage VREF. Since the first current controlling circuit 48 is disabled, the first current Ib1 becomes zero. As a result, the phase differences between the in-phase signals Ip and In and the quadrature signals Qp and Qn can vary between 90° and 180°.

An NMOS transistor N81 connected to the first current controlling circuit 48 and the NMOS transistor N33 in the first amplifier 43 form a current mirror. Thus, the first current Ib1 flowing through the NMOS transistor N33 is equal to a current flowing through the NMOS transistor N81. In addition, an NMOS transistor N82 connected to the first current controlling circuit 48 and the NMOS transistor N43 in the second amplifier 44 form a current mirror. Therefore, the second current Ir-Ib1 flowing through the NMOS transistor N43 is identical to a current flowing through the NMOS transistor N82.

An NMOS transistor N91 connected to the second current controlling circuit 49 and the NMOS transistor N53 in the third amplifier 45 form a current mirror. Therefore, the third current Ib2 flowing through the NMOS transistor N53 is identical to a current flowing through the NMOS transistor N91. An NMOS transistor N92 connected to the second current controlling circuit 49 and the NMOS transistor N63 in the fourth amplifier 46 form a current mirror. Therefore, the fourth current Ir-Ib2 flowing through the NMOS transistor N53 is equal to a current flowing through the NMOS transistor N92.

Accordingly, the first current Ib1 flowing through the NMOS transistor N81 connected to the first current controlling circuit 48 and the third current Ib2 flowing through the NMOS transistor N91 connected to the second current controlling circuit 49 can vary by varying the input voltage VIN. As a result, the first, second, third, and fourth currents Ib1, Ir-Ib1, Ib2, and Ir-Ib2, which flow through the NMOS transistors N33, N43, N53, and N63 in the first, second, third, and fourth amplifiers 43, 44, 45, and 46, can vary.

Figure 5:
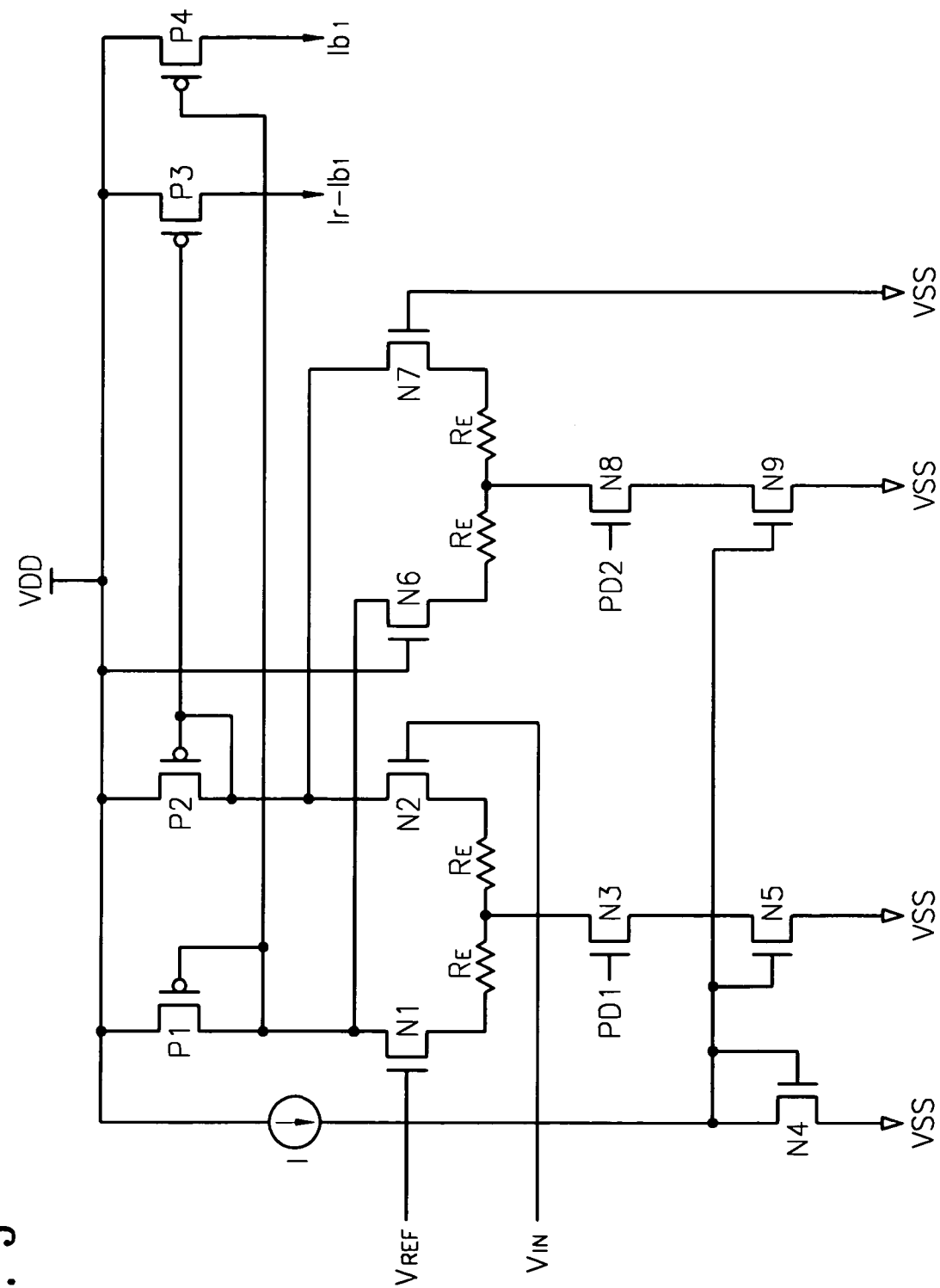
FIG. 5 is a circuit diagram of the first current controlling circuit of FIG. 4.

FIG. 5 is a detailed circuit diagram of the first current controlling circuit 48 of FIG. 4. Referring to FIG. 5, the first current controlling circuit includes PMOS transistors P1, P2, P3, and P4, NMOS transistors N1, N2, N3, N4, N5, N6, N7, N8, and N9, a current source 1, and resistances RE.

When the first control signal PD1 is enabled to be logic "high" and the second control signal PD2 is disabled to be logic "low", the NMOS transistor N3 is turned on and the NMOS transistor N8 is turned off. Thus, the first current Ib1 and the second current Ir-Ib1 vary depending on the voltage difference between the input voltage VIN and the predetermined reference voltage VREF.

When the first control signal PD1 is disabled to be logic "low" and the second control signal PD2 is enabled to be logic "high", the NMOS transistor N3 is turned on and the NMOS transistor N8 is turned off. Thus, the first current Ib1 is "0" and the second current Ir-Ib1 has an equal value to the predetermined reference current Ir.

The second current controlling circuit 49 shown in FIG. 4 has the same configuration as the first current controlling circuit 48 except that the second control signal PD2 is connected to the gate of the NMOS transistor N3 and the first control signal PD1 is connected to the gate of the NMOS transistor N8.

Figure 6:
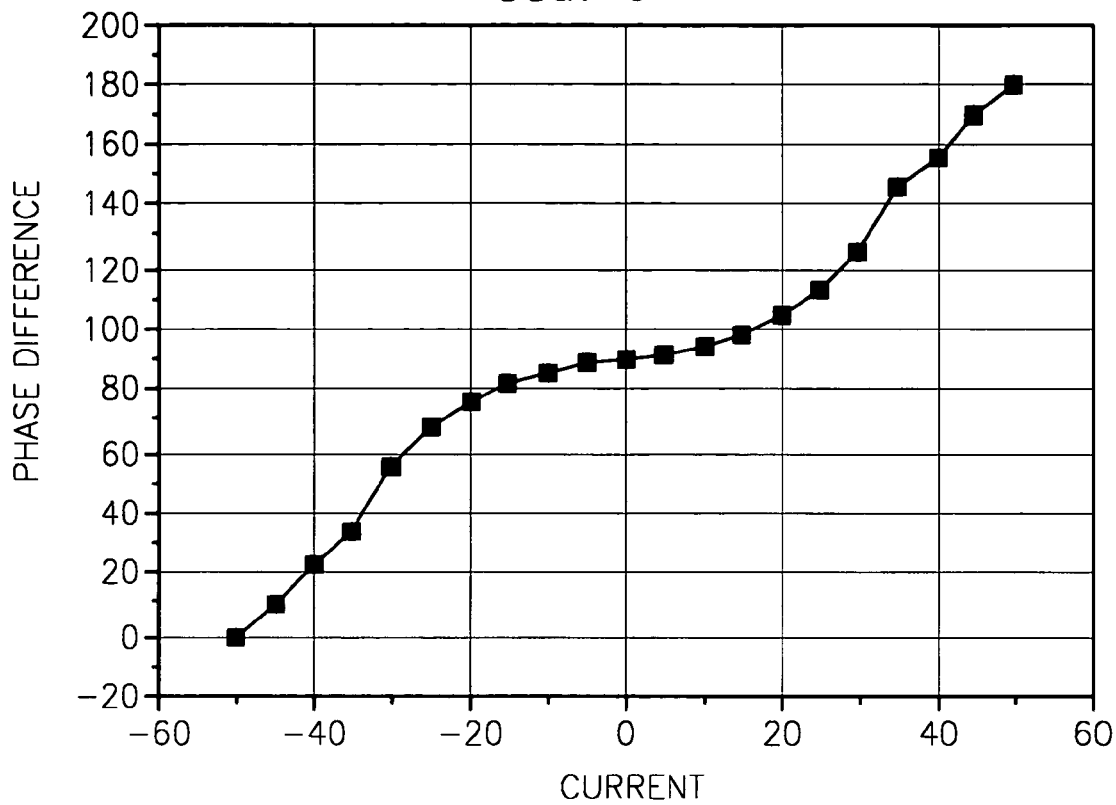
FIG. 6 is a graph showing the results of a simulation of phase differences between I and Q output signals with respect to variations in currents when the quadrature VCO of FIG. 4 does not include current controlling circuits.

FIG. 6 is a graph showing the results of a simulation of phase differences between the in-phase signals Ip and In and the quadrature signals Qp and Qn with respect to variations in the first current Ib1 and the second current Ib2 when the quadrature VCO of FIG. 4 does not include the first and second current controlling circuits 48 and 49. In this simulation, the inductors L1 and L2 were set to be 2 nH, the capacitors C1 and C2 were set to be 2 pf, and the predetermined reference current Ir was set to be 50 uA.

In FIG. 6, the X-axis denotes the first and third currents Ib1 and Ib2. On the X-axis, "0" denotes a value when the first current Ib1 is "0" and the third current Ib2 is "0", "+" values denote values of the first current Ib1 when the third current Ib2 is "0", and "−" values denote values of the third value Ib2 when the first current Ib1 is "0". Referring to FIG. 6, when both the first and third currents Ib1 and Ib2 are "0" (the X-axis is "0"), the phase differences between the in-phase signals Ip and In and the quadrature signals Qp and Qn are 90°. When the first current Ib1 is 50 uA and the third current Ib2 is "0" (the X-axis is +50), the phase differences between the in-phase signals Ip and In and the quadrature signals Qp and Qn are 180°. When the first current Ib1 is "0" and the third current Ib2 is 50 uA (the X-axis is −50), the phase differences between the in-phase signals Ip and In and the quadrature signals Qp and Qn are 0°.

In other words, the phase differences between the in-phase signals Ip and In and the quadrature signals Qp and Qn can vary between 0° and 180° by varying the first and third currents Ib1 and Ib2.

Figure 7:
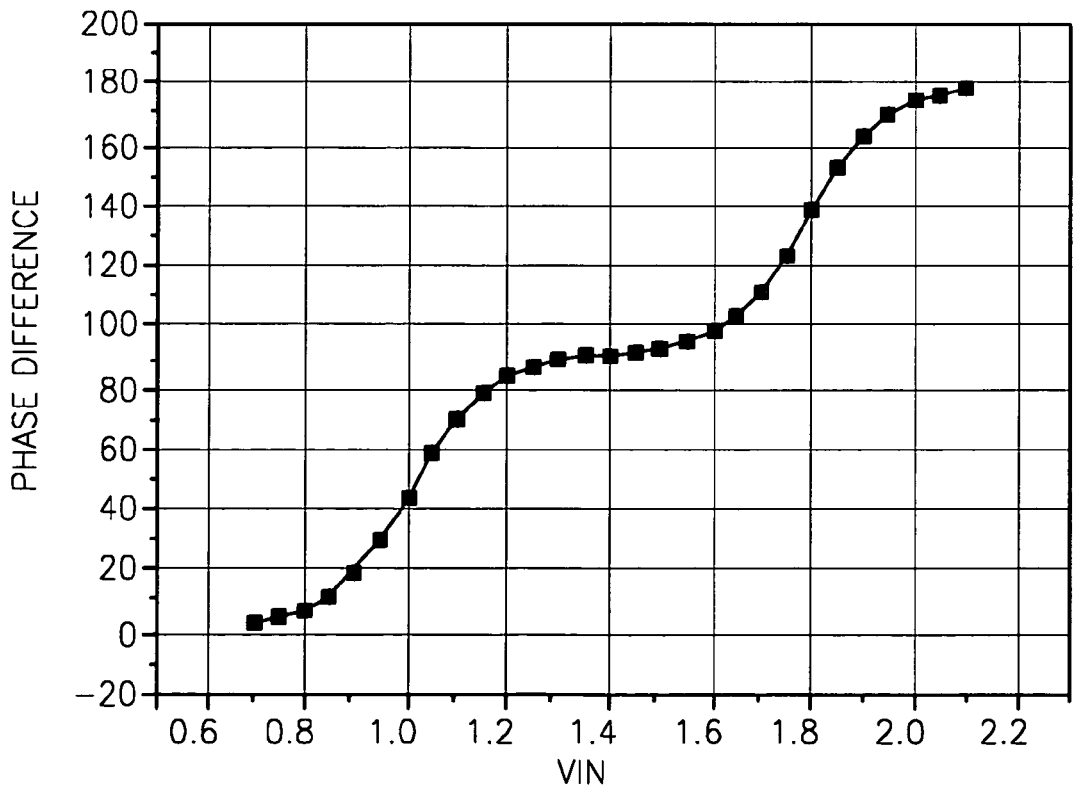
FIG. 7 is a graph showing the results of a simulation of phase differences between I and Q output signals with respect to variations in an input voltage when the quadrature VCO of FIG. 4 includes current controlling circuits.

FIG. 7 is a graph showing the results of a simulation of phase differences between the in-phase signals Ip and In and the quadrature signals Qp and Qn with respect to variations in the input voltage VIN when the quadrature VCO of FIG. 4 includes the first and second current controlling circuits 48 and 49. In this simulation, the inductors L1 and L2 were set to be 2 nH, the capacitors C1 and C2 were set to be 2 pF, the reference current Ir was set to be 50 uA, and the reference voltage VREF was set to be 1.4V.

Referring to FIG. 7, when the input voltage VIN of 1.4V is equal to the reference voltage VREF, the phase differences between the in-phase signals Ip and In and the quadrature signals Qp and Qn are 90°. When the input voltage VIN is greater than the reference voltage VREF, the phase differences between the in-phase signals Ip and In and the quadrature signals Qp and Qn vary between 90° and 180°. When the input voltage VIN is less than the reference voltage VREF, the phase differences between the in-phase signals Ip and In and the quadrature signals Qp and Qn vary between 0° and 90°.

That is, the input voltage VIN can be variably input from an external source, which results in variations in the first and third currents Ib1 and Ib2. As a result, the phase differences between the in-phase signals Ip and In and the quadrature signals Qp and Qn can vary between 0° and 180°.

As described above, in a quadrature VCO according to the present invention, the input voltage VIN can be variably input from an external source. Thus, phase differences between the in-phase signals Ip and In and the quadrature signals Qp and Qn can vary between 0° and 180° on a basis of 90°. Therefore, the quadrature VCO can contribute to the considerable improvement in the performance of a transceiver in a mobile system adopting Low-IF or direct-conversion.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A quadrature voltage controlled oscillator comprising:
    a first voltage controlled oscillator that generates a first output and a second output;
    a second voltage controlled oscillator that generates a third output and a fourth output;
    a first amplifier that drives the first voltage controlled oscillator in response to the second voltage controlled oscillator;
    a second amplifier that drives the first voltage controlled oscillator in response to the second voltage controlled oscillator;
    a third amplifier that drives the second voltage controlled oscillator in response to the first voltage controlled oscillator; and
    a fourth amplifier that drives the second voltage controlled oscillator in response to the first voltage controlled oscillator, wherein the first amplifier is controlled by a first current, the second amplifier is controlled by a second current, the third amplifier is controlled by a third current, and the fourth amplifier is controlled by a fourth current.

2. The quadrature voltage controlled oscillator of claim 1, wherein the second current is a value obtained from subtraction of the first current from a reference current.

3. The quadrature voltage controlled oscillator of claim 1, wherein the fourth current is a value obtained from subtraction of the third current from a reference current.

4. The quadrature voltage controlled oscillator of claim 1, further comprising:
    a control signal generating circuit that enables a first control signal when an input voltage is greater than a reference voltage, and enables a second control signal when the input voltage is less than the reference voltage;

a first current controlling circuit that varies the first current and the second current depending on a voltage difference between the input voltage and the reference voltage when the first control signal is enabled; and a second current controlling circuit that varies the third current and the fourth current depending on the voltage difference between input voltage and the reference voltage when the second control signal is enabled.

5. The quadrature voltage controlled oscillator of claim 1, wherein the first output is a positive in-phase signal, and the second output is a negative in-phase signal.

6. The quadrature voltage controlled oscillator of claim 1, wherein the third output is a positive quadrature signal, and the fourth output is a negative quadrature signal.

7. The quadrature voltage controlled oscillator of claim 1, wherein the first amplifier comprises:
   a first NMOS transistor;
   a second NMOS transistor; and
   a third NMOS transistor that allows the first current to flow in response to a gate signal.

8. The quadrature voltage controlled oscillator of claim 1, wherein the second amplifier comprises:
   a first NMOS transistor;
   a second NMOS transistor; and
   a third NMOS transistor that allows the second current to flow in response to a gate signal.

9. The quadrature voltage controlled oscillator of claim 1, wherein the third amplifier comprises:
   a first NMOS transistor;
   a second NMOS transistor; and
   a third NMOS transistor that allows the third current to flow in response to a gate signal.

10. The quadrature voltage controlled oscillator of claim 1, wherein the fourth amplifier comprises:
    a first NMOS transistor;
    a second NMOS transistor; and
    a third NMOS transistor that allows the fourth current to flow in response to a gate signal.

11. A quadrature voltage controlled oscillator comprising:
    a first voltage controlled oscillator that generates a positive in-phase output signal and a negative in-phase output signal;
    a second voltage controlled oscillator that generates a positive quadrature output signal and a negative quadrature output signal;
    a first amplifier that is controlled by a first current and drives the first voltage controlled oscillator in response to the second voltage controlled oscillator;
    a second amplifier that is controlled by a second current and drives the first voltage controlled oscillator in response to the second voltage controlled oscillator;
    a third amplifier that is controlled by a third current and drives the second voltage controlled oscillator in response to the first voltage controlled oscillator; and
    a fourth amplifier that is controlled by a fourth current and drives the second voltage controlled oscillator in response to the first voltage controlled oscillator,
    wherein the first through fourth currents vary depending on a level of an input voltage so as to vary phase differences between the positive and negative in-phase output signals and the positive and negative quadrature output signals.

12. The quadrature voltage controlled oscillator of claim 11, wherein the second current is a value obtained from subtraction of the first current from a reference current.

13. The quadrature voltage controlled oscillator of claim 11, wherein the fourth current is a value obtained from subtraction of the third current from a reference current.

14. The quadrature voltage controlled oscillator of claim 11, further comprising:
    a control signal generating circuit that enables a first control signal when an input voltage is greater than a reference voltage, and enables a second control signal when the input voltage is less than the reference voltage;
    a first current controlling circuit that varies the first current and the second current depending on a voltage difference between the input voltage and the reference voltage when the first control signal is enabled; and
    a second current controlling circuit that varies the third current and the fourth current depending on the voltage difference between input voltage and the reference voltage when the second control signal is enabled.

15. The quadrature voltage controlled oscillator of claim 11, wherein the first amplifier comprises:
    a first NMOS transistor;
    a second NMOS transistor; and
    a third NMOS transistor that allows the first current to flow in response to a gate signal.

16. The quadrature voltage controlled oscillator of claim 11, wherein the second amplifier comprises:
    a first NMOS transistor;
    a second NMOS transistor; and
    a third NMOS transistor that allows the second current to flow in response to a gate signal.

17. The quadrature voltage controlled oscillator of claim 11, wherein the third amplifier comprises:
    a first NMOS transistor;
    a second NMOS transistor; and
    a third NMOS transistor that allows the third current to flow in response to a gate signal.

18. The quadrature voltage controlled oscillator of claim 11, wherein the fourth amplifier comprises:
    a first NMOS transistor;
    a second NMOS transistor; and
    a third NMOS transistor that allows the fourth current to flow in response to a gate signal.

* * * * *